United States Patent
Kim et al.

(10) Patent No.: US 7,227,805 B2
(45) Date of Patent: Jun. 5, 2007

(54) SEMICONDUCTOR MEMORY DEVICE HAVING A GLOBAL DATA BUS

(75) Inventors: Kyoung-Nam Kim, Kyoungki-do (KR); Seok-Cheol Yoon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 109 days.

(21) Appl. No.: 11/125,447

(22) Filed: May 9, 2005

(65) Prior Publication Data

US 2005/0259499 A1 Nov. 24, 2005

(30) Foreign Application Priority Data

May 10, 2004 (KR) ...................... 10-2004-0032794

(51) Int. Cl.
*G11C 8/00* (2006.01)
(52) U.S. Cl. ........................... 365/230.03; 365/230.05; 365/239
(58) Field of Classification Search ........... 365/230.03, 365/230.05, 239, 233, 191, 226, 189.01
See application file for complete search history.

(56) References Cited

U.S. PATENT DOCUMENTS

| | | | |
|---|---|---|---|
| 5,781,495 A | 7/1998 | Arimoto | |
| 5,831,924 A | 11/1998 | Nitta et al. | |
| 6,028,811 A | 2/2000 | Brown | |
| 6,091,659 A | 7/2000 | Watanabe et al. | |
| 6,137,746 A | 10/2000 | Kengeri et al. | |
| 6,215,721 B1 | 4/2001 | Kim | |
| 6,249,474 B1 | 6/2001 | Arimoto | |
| 6,314,045 B1 | 11/2001 | Ikeda | |
| 6,327,214 B1 | 12/2001 | Yoon et al. | |
| 6,378,102 B1 | 4/2002 | Watanabe et al. | |
| 7,016,255 B2* | 3/2006 | Lee et al. | 365/230.05 |
| 2005/0276146 A1* | 12/2005 | Ha et al. | 365/230.03 |

FOREIGN PATENT DOCUMENTS

| | | |
|---|---|---|
| JP | 2000-163951 | 6/2000 |
| KR | 2002-0066012 | 8/2002 |
| KR | 2003-0043410 | 6/2003 |

* cited by examiner

*Primary Examiner*—Son Dinh
*Assistant Examiner*—Dang Nguyen
(74) *Attorney, Agent, or Firm*—Blakely Sokoloff Taylor & Zafman

(57) ABSTRACT

There is provided a semiconductor design technology, particularly, a bus line arrangement method of global data bus in the semiconductor memory device. According to the invention, skew by lines can be not occurred, or can be minimized upon an issuance thereof. Further, upon its issuance, it is easy to compensate it relying on the specific rule. The present invention proposes a scheme that classifies data transmission units corresponding to each bank into plural groups, each group having some continuous data transmission units, and makes bus lines of the global data bus to be arranged alternately for each group. In other words, the global data bus line arrangement scheme suggested by the present invention may be defined as grouped alternate arrangement scheme. In this case, the overlap interval between adjacent global data bus lines can be reduced largely and skew problem by lines can also be solved.

4 Claims, 4 Drawing Sheets

SEMICONDUCTOR MEMORY DEVICE HAVING A GLOBAL DATA BUS

FIELD OF THE INVENTION

The present invention relates to a semiconductor design technology; and, more particularly, to a bus line arrangement of a global data bus GIO in a semiconductor memory device.

BACKGROUND OF THE INVENTION

As is well known, most of semiconductor memory devices including DRAM have a hierarchical I/O bus structure. In other words, those devices have a structure that connects global data bus GIO plural banks share to local data bus LIO prepared in each bank hierarchically.

Specifically, the global data bus is coupled with an I/O pad and the local data bus of each bank. In this structure, data transmission unit is needed for data transmission between the global data bus and the local data bus. In general, such data transmission unit comprises a write driver for driving input data on the global data bus onto the local data bus, and an I/O sense amp for loading output data on the local data bus onto the global data bus.

Meanwhile, as a size of the semiconductor memory chip becomes small, a line interval between the global data bus GIO lines (conventionally, DRAM has 16 bus lines) becomes decrease. Thus, signals on adjacent global data bus lines may be affected by noises due to coupling, resulting in an issuance of data errors under the serious state.

FIG. 1 depicts an arrangement method of a global data bus GIO in a 512M DDR2 DRAM according to the prior art.

As shown in FIG. 1, a memory device comprises 4 banks, BANK0 to BANK3. Each bank includes even cell region and odd cell region. And, the even cell region and the odd cell region share one row decoder XDEC, each of which is unit region selected by separate column decoder YDEC. Each of the even cell region and the odd cell region is provided with local data bus LIO and also data transmission unit, independently.

In the meantime, there are arranged 16 I/O pads DQ between upper banks BANK0 and BANK1 and lower banks BANK2 and BANK3, and also is arranged global data bus GIO in a row direction between the I/O pads DQ and the upper banks BANK0 and BANK1. Also, there is arranged a global data bus GIO (not shown) between the I/O pads DQ and the lower banks BANK2 and BANK3. For reference, the bus line in a row direction (or horizontal direction) is embodied in a first metal wire, and the bus line in a column direction (or vertical direction) is implemented with a second metal wire, in which the first and the second metal wires are coupled via a contact.

The global data bus GIO has 16 bus lines corresponding to the 16 I/O pads DQ, wherein adjacent two banks BANK0 and BANK1 hold those bus lines in common. To be more specific, each of the 16 data transmission units corresponding to the local data buses LIOs in the odd cell regions of each of the banks BANK0 and BANK1 shares one global data bus line. Likewise, each of the 16 data transmission units corresponding to the local data buses LIOs in the even cell regions of each of the banks BANK0 and BANK1 shares one global data bus line. Accordingly, there are arranged total 32 global data bus lines between the I/O pads DQ and the upper banks BANK0 and BANK1.

For information, it is known that the layout order, 0, 15, 1, 14, 2, 13, 3, 12, 4, 11, 5, 10, 6, 9, 7, 8, of the I/O pads DQ and the data transmission units is an unique sequence according to pin configuration under the standard specification.

In the prior art arraying the bus lines of the global data bus, as described above, the 16 global data bus lines for connection between the odd cell regions of the two banks BANK0 and BANK1 and the I/O pads DQ are arrayed in the order of 0, 15, 1, 14, 2, 13, 3, 12, 4, 11, 5, 10, 6, 9, 7, 8, based on the layout sequence of the I/O pads DQ and the data transmission units; and following the above sequence, the 16 global data bus lines for connection between odd cell regions of the two banks BANK0 and BANK1 and the I/O pads DQ are arrayed in sequence.

According to this global data bus GIO arrangement method, there occurs constant overlap interval (for the interval embodied in the first metal wire merely) between the adjacent global data bus lines. This overlap interval may be a primary factor that originates coupling noise in the adjacent global data bus lines as mentioned above, wherein it is shown in the general sequential global data bus GIO arrangement method that the overlap interval is maximum, meaning an issuance of maximum coupling noise.

In case of the existing memory chip, such coupling noise between the bus lines is not an issue since layout area for routing of the global data bus is fully guaranteed. However, as the memory chip becomes high integrated, the enlargement of the bank region is inevitable and thus the layout area for routing of the global data bus becomes relatively small. Accordingly, this coupling noise between the adjacent global data bus lines has been very important consideration in the process of the chip design. Meanwhile, since it is expected that the future memory chip supports more wide bandwidth and is provided with the global data bus of 32 or 64 bits, it will be apparent that the coupling noise between the adjacent global data bus lines would occur more serious problem.

As one scheme of alleviating this coupling noise, there may be a guarantee of the space between the global data buses, which may not be a consideration due to a shortcoming that increases the chip size.

As another scheme, meanwhile, there may be an idea that makes the layout sequence of the global data bus lines random, contrary to the concept that arraying the global data lines sequentially results in maximum coupling noise. In this case, the total coupling noise amount of the global data bus may decrease compared to the existing method shown in FIG. 1, but makes a length of the overlap interval for each line inconstant. As such, if the length of the overlap interval for each line is not constant, then the loading value of each global data bus line is different. This may result in a problem allowing a different delay time for each line. In this case, there may be a need of an extra circuit for removing skew between the global data bus lines, and also may be a difficulty to guarantee the chip's operation characteristics since the skew by lines is also random although the skew circuit is utilized while yielding damage to the chip area.

SUMMARY OF THE INVENTION

It is, therefore, a primary object of the present invention to provide to a semiconductor memory device that is capable of alleviating coupling noise, without an expansion of line interval of a global data bus.

In an aspect of the present invention, there is provided a semiconductor memory device having a plurality of banks, including a plurality of input/output (I/O) pads prepared for data input and output; a global data bus arranged between banks neighboring in a first direction and the I/O pads; and a plurality of data transmission units for data transmission between each bank and the global data bus, wherein the data transmission units corresponding to said each bank are classified into a multiplicity of groups, each group having plural continuous data transmission units, and bus lines in the first direction of the global data bus corresponding to each data transmission unit are arranged sequentially and alternately for each group.

In another aspect of the present invention, there is provided a semiconductor memory device, including a plurality of banks having a first and a second cell regions, which share one row decoder and are unit region selected by a first and a second column decoders; a plurality of input/output (I/O) pads prepared for data input and output; a global data bus arranged between banks neighboring in a first direction and the I/O pads; a plurality of first data transmission units for data transmission between the first cell region and the global data bus; and a plurality of second data transmission units for data transmission between the second cell region and the global data bus, wherein bus lines in the first direction of the global data bus corresponding to the first and the second data transmission units are arranged sequentially and alternately for each cell region.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
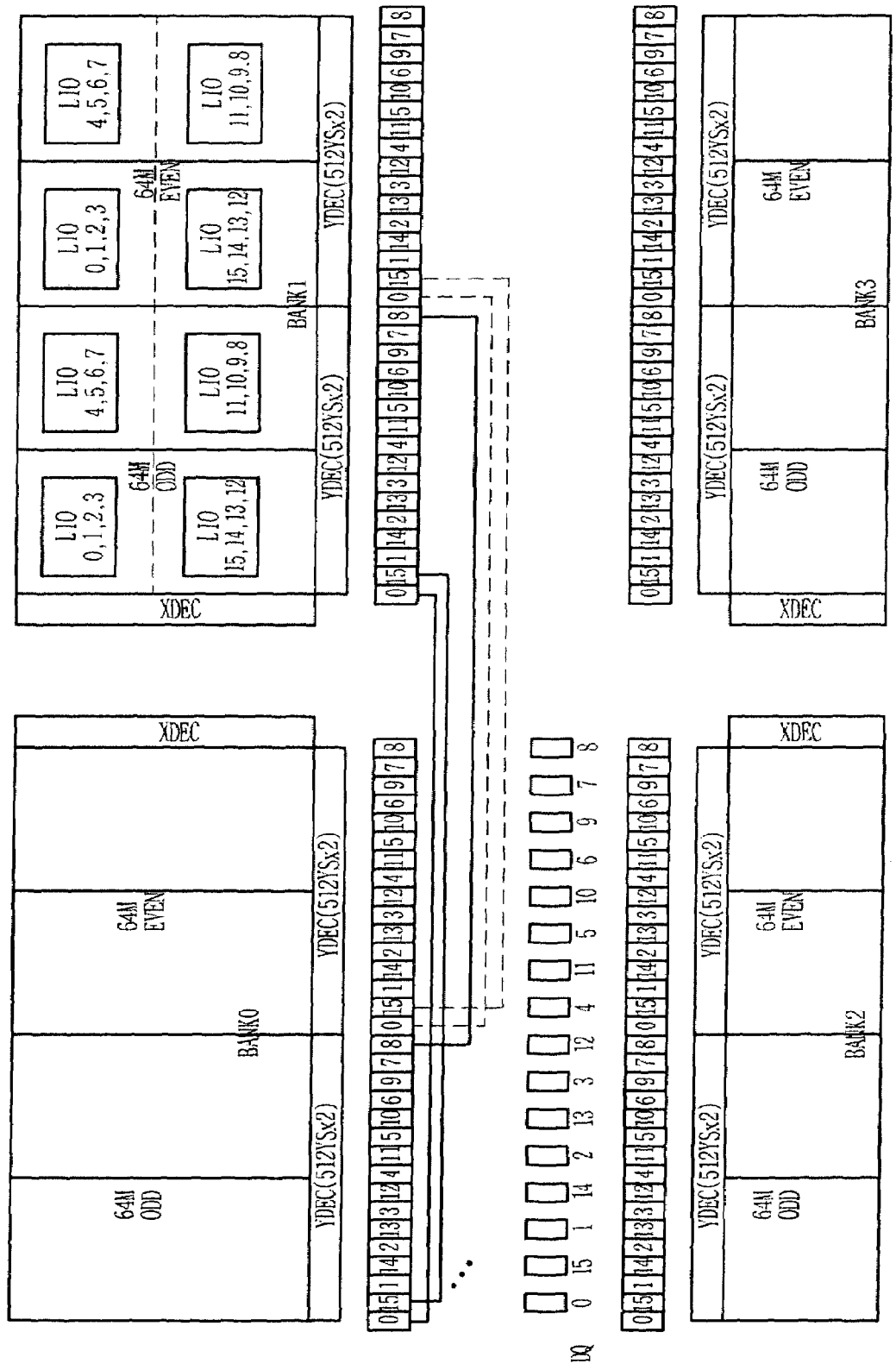
FIG. 1 is a diagram representing an arrangement method of a global data bus of a conventional 512M DDR2 DRAM.

In accordance with a first embodiment of the present invention, there is provided a semiconductor memory device having a plurality of banks comprising: a plurality of input/output (I/O) pads prepared for data input and output; a global data bus arranged between banks neighboring in a first direction and the I/O pads; and a plurality of data transmission units for data transmission between each bank and the global data bus, wherein the data transmission units corresponding to said each bank are classified into a multiplicity of groups, each group having plural continuous data transmission units, and bus lines in the first direction of the global data bus corresponding to each data transmission unit are arranged sequentially and alternately for each group.

Herein, it is desirable that bus lines in the first direction of the global data bus corresponding to the data transmission units included in each group are arranged in sequence.

Further, it is preferable that the arrangement order of the bus lines in the first direction of the global data bus is symmetrical for each group.

In accordance with a second embodiment of the present invention, there is provided a semiconductor memory device comprising: a plurality of banks having a first and a second cell regions, which share one row decoder and are unit region selected by a first and a second column decoders; a plurality of input/output (I/O) pads prepared for data input and output; a global data bus arranged between banks neighboring in a first direction and the I/O pads; a plurality of first data transmission units for data transmission between the first cell region and the global data bus; and a plurality of second data transmission units for data transmission between the second cell region and the global data bus, wherein bus lines in the first direction of the global data bus corresponding to the first and the second data transmission units are arranged sequentially and alternately for each cell region.

Herein, it is desirable that bus lines in the first direction of the global data bus corresponding to one data transmission unit are arranged in sequence.

Further, it is preferable that the arrangement order of the bus lines in the first direction of the global data bus corresponding to the first data transmission units is symmetrical to that of the bus lines in the first direction of the global data bus corresponding to the second data transmission units.

In accordance with a third embodiment of the present invention, there is provided a semiconductor memory device having a plurality of banks comprising: 16 input/output (I/O) pads for data input and output, which are arranged in the order of 0, 15, 1, 14, 2, 13, 3, 12, 4, 11, 5, 10, 6, 9, 7, and 8; a global data bus arranged between a first and a second banks neighboring in a row direction and the 16 I/O pads; and 16 data transmission units for data transmission between each bank and the global data bus, which are arranged in the order of 0, 15, 1, 14, 2, 13, 3, 12, 4, 11, 5, 10, 6, 9, 7, and 8.

In accordance with a fourth embodiment of the present invention, there is provided a semiconductor memory device having a plurality of banks comprising: 16 input/output (I/O) pads for data input and output, which are arranged in the order of 0, 15, 1, 14, 2, 13, 3, 12, 4, 11, 5, 10, 6, 9, 7, and 8; a global data bus arranged between a first and a second banks neighboring in a row direction and the 16 I/O pads; and 16 data transmission units for data transmission between each bank and the global data bus, which are arranged in the order of 0, 15, 1, 14, 2, 13, 3, 12, 4, 11, 5, 10, 6, 9, 7, and 8, wherein bus lines in the first direction of the global data bus corresponding to each data transmission unit are arranged in the order of 0, 4, 2, 6, 15, 11, 13, 9, 1, 5, 3, 7, 14, 10, 12, and 8.

In accordance with a fifth embodiment of the present invention, there is provided a semiconductor memory device comprising: a plurality of banks having odd and even cell regions, which share one row decoder and are unit region selected by a first and a second column decoders; 16 input/output (I/O) pads for data input and output, which are arranged in the order of 0, 15, 1, 14, 2, 13, 3, 12, 4, 11, 5, 10, 6, 9, 7, and 8; a global data bus arranged between a first and a second banks neighboring in a row direction and the 16 I/O pads; 16 data transmission units for data transmission between the odd cell regions and the global data bus, which are arranged in the order of $0_{ODD}$, $4_{ODD}$, $15_{ODD}$, $11_{ODD}$, $1_{ODD}$, $5_{ODD}$, $14_{ODD}$, $10_{ODD}$, $2_{ODD}$, $6_{ODD}$, $13_{ODD}$, $9_{ODD}$, $3_{ODD}$, $7_{ODD}$, $12_{ODD}$, and $8_{ODD}$; and 16 data transmission units for data transmission between the even cell regions and the global data bus, which are arranged in the order of $0_{EVEN}$, $4_{EVEN}$, $15_{EVEN}$, $11_{EVEN}$, $1_{EVEN}$, $5_{EVEN}$, $14_{EVEN}$, $10_{EVEN}$, $2_{EVEN}$, $6_{EVEN}$, $13_{EVEN}$, $9_{EVEN}$, $3_{EVEN}$, $7_{EVEN}$, $12_{EVEN}$, and $8_{EVEN}$, wherein bus lines in the row direction of the global data bus corresponding to the 32 data transmission units are arranged in the order of $0_{ODD}$, $0_{EVEN}$, $4_{ODD}$, $4_{EVEN}$, $15_{ODD}$, $15_{EVEN}$, $11_{ODD}$, $11_{EVEN}$, $1_{ODD}$, $1_{EVEN}$, $5_{ODD}$, $5_{EVEN}$, $14_{ODD}$, $14_{EVEN}$, $10_{ODD}$, $10_{EVEN}$, $2_{ODD}$, $2_{EVEN}$, $6_{ODD}$, $6_{EVEN}$, $13_{ODD}$, $13_{EVEN}$, $9_{ODD}$, $9_{EVEN}$, $3_{ODD}$, $3_{EVEN}$, $7_{ODD}$, $7_{EVEN}$, $12_{ODD}$, $12_{EVEN}$, $8_{ODD}$, and $8_{EVEN}$.

As described early, there is a need of a specific rule for arrangement of the global data bus lines. Under such specific rule, skew by lines can't be occurred, or can be minimized upon its issuance. Further, upon the issuance thereof, it is easy to compensate the same, relying on the specific rule. The present invention proposes a scheme that classifies data transmission units corresponding to each bank into plural groups, each of which has some continuous data transmission units, and allows routing sequence of global data bus lines to be arranged alternately by groups. In other words, the global data bus line arrangement scheme suggested by the present invention may be defined as grouped alternate arrangement scheme. In this case, the overlap interval between adjacent global data bus lines can be reduced largely and skew problem by lines can also be solved.

Hereinafter, preferred embodiments of the present invention will be described in detail with reference to the accompanying drawings so that an ordinary person skilled in the art could readily conceive the present invention.

Figure 2:
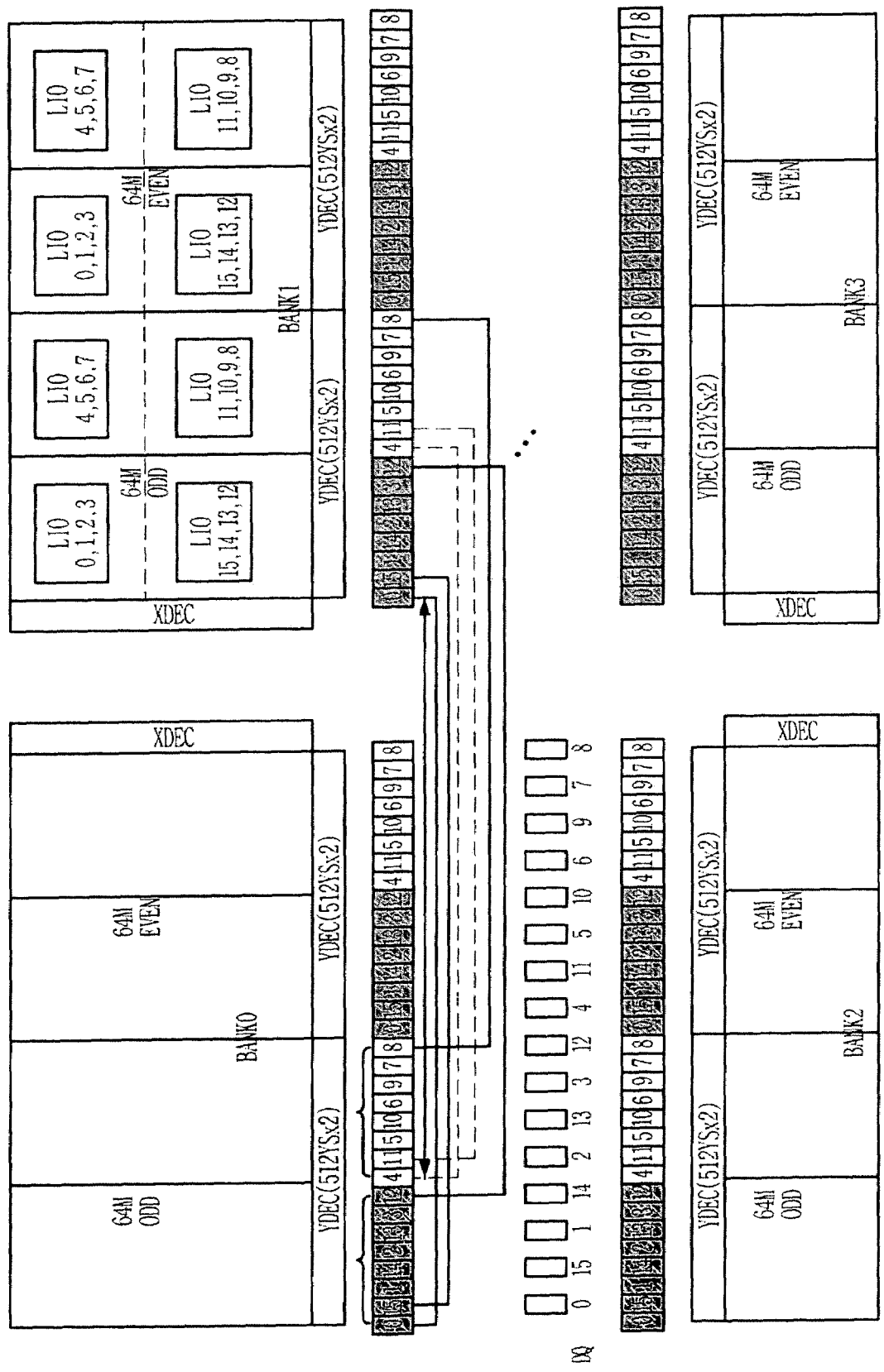
FIG. 2 is a diagram illustrating an arrangement method of a global data bus GIO of a 512M DDR2 DRAM in accordance with a first embodiment of the present invention.

FIG. 2 shows a diagram illustrating an arrangement scheme of a global data bus GIO of a 512M DDR2 DRAM in accordance with a first embodiment of the present invention.

As shown in FIG. 2, a basic structure of the memory chip in accordance with the present invention is the same as that shown in FIG. 1 except that the line arrangement sequence of the global data bus GIO is different each other.

First of all, in the first embodiment of the invention, there are provided two groups into which data transmission units corresponding to odd cell regions and even cell regions in two banks BANK0 and BANK1 are classified. That is, seeing only the data transmission units corresponding to the odd cell regions, 0, 15, 1, 14, 2, 13, 3, and 12 are assigned the fist group, and 4, 11, 5, 10, 6, 9, 7, and 8 are assigned the second group.

According to the line arrangement sequence of the global data bus GIO, a bus line corresponding to one data transmission unit selected in the first group is arranged and a bus line corresponding to one data transmission unit selected in the second group is arranged; and then following bit lines in the first and the second groups are alternately arranged in sequence.

As a result, the bus lines of the global data bus GIO corresponding to the odd cell regions are arranged in the order of 0, 4, 15, 11, 1, 5, 14, 10, 2, 6, 13, 9, 3, 7, 12, and 8.

Meanwhile, although there is not shown, following the bus line 8 that is the last bus line among the bus lines of the global data bus GIO corresponding to the odd cell regions, there are arranged the bus lines of the global data bus GIO corresponding to the even cell regions in the order of 0, 4, 15, 11, 1, 5, 14, 10, 2, 6, 13, 9, 3, 7, 12, 8.

When comparing with FIG. 1, it can be seen that overlap interval (indicated by an arrow) between adjacent bus lines is reduced largely, meaning that coupling noise of the global data bus GIO is decreased. Meanwhile, using the first embodiment of the present invention, there exists no skew between the bus lines because the overlap interval (indicated by an arrow) between the adjacent bus lines seems to be constant for all the bus lines.

Figure 3:
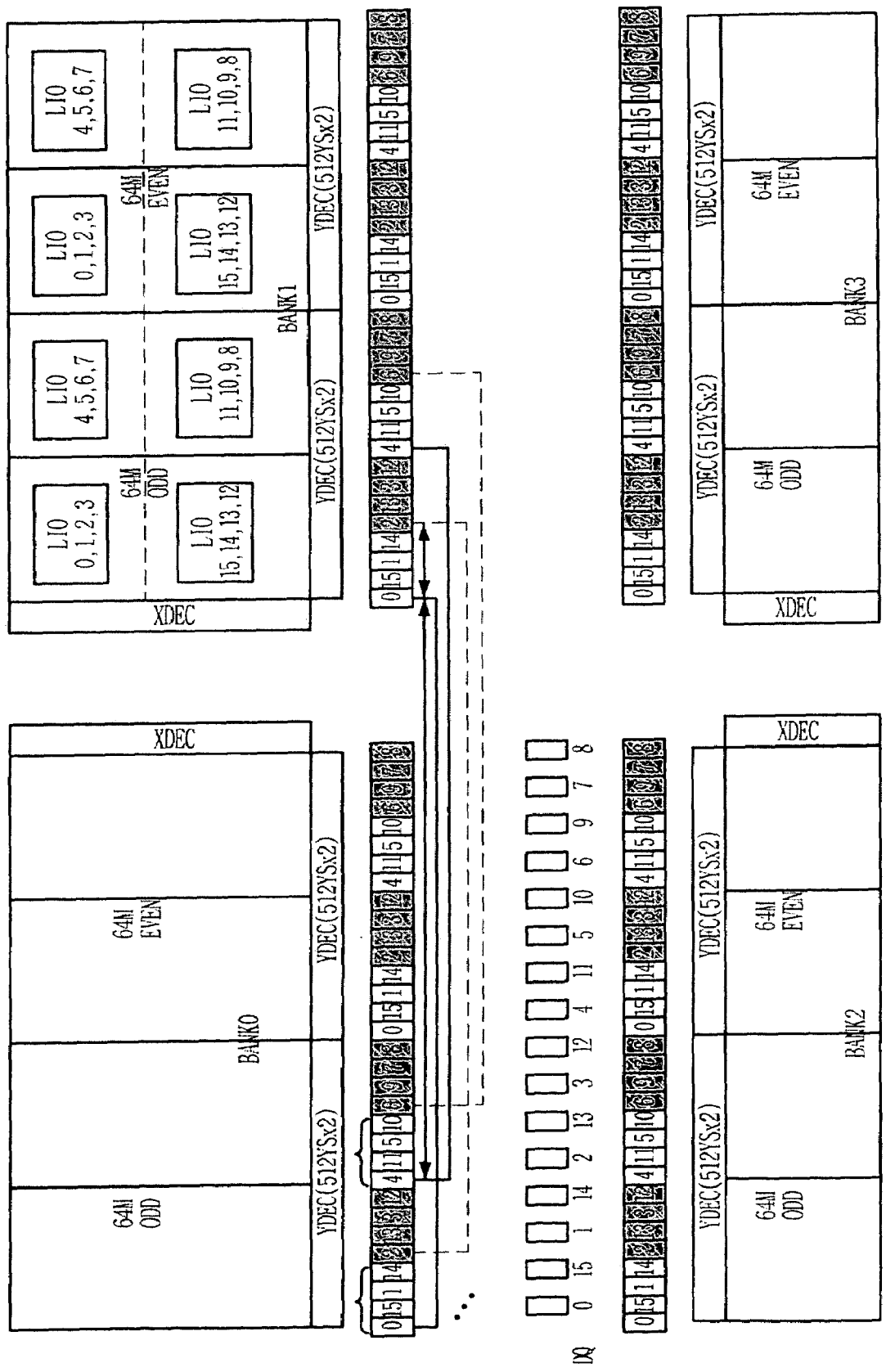
FIG. 3 is a diagram showing an arrangement scheme of a global data bus GIO of a 512M DDR2 DRAM in accordance with a second embodiment of the present invention.

FIG. 3 is a diagram showing an arrangement scheme of a global data bus GIO of a 512M DDR2 DRAM in accordance with a second embodiment of the present invention.

Referring to FIG. 3, the global data bus GIO arrangement method in accordance with the second embodiment of the invention is different from the first embodiment described above in that the data transmission units are classified into four groups, when comparing with the first embodiment as disclosed above. That is, there are provided four groups into which data transmission units corresponding to odd cell regions and even cell regions in two banks BANK0 and BANK1 are classified. Seeing only the data transmission units corresponding to the odd cell regions, there are assigned the first group for 0, 15, 1, 14, the second group for 2, 13, 3, 12, the third group for 4, 11, 5, 10, and the fourth group for 6, 9, 7, 8.

According to the line arrangement sequence of the global data bus GIO, a bus line corresponding to one data transmission unit selected in the first group is arranged, a bus line corresponding to one data transmission unit selected in the second group is arranged, a bus line corresponding to one data transmission unit selected in the third group is arranged, and a bus line corresponding to one data transmission unit selected in the fourth group is arranged; and then following bit lines in the first, the second, the third and the fourth groups are alternately arranged in sequence.

As a result, the bus lines of the global data bus GIO corresponding to the odd cell regions are arranged in the order of 0, 4, 2, 6, 15, 11, 13, 9, 1, 5, 3, 7, 14, 10, 12, and 8.

Meanwhile, although there is not shown, following the bus line 8 that is the last bus line among the bus lines of the global data bus GIO corresponding to the odd cell regions, there are arranged the bus lines of the global data bus GIO corresponding to the even cell regions in the order of 0, 4, 2, 6, 15, 11, 13, 9, 1, 5, 3, 7, 14, 10, 12, and 8.

Using the second embodiment of the invention, when comparing with FIG. 1, it can be seen that overlap interval (indicated by a long arrow) between adjacent bus lines is reduced largely. Meanwhile, contrary to the first embodiment of the invention, there may be a partial difference (indicated by a short arrow) of overlap interval between adjacent bus lines. However, in the second embodiment of the invention, most of overlap intervals are identical; and thus, even when there exist a partial difference (indicated by a short arrow) of overlap intervals, there may be occurred no specific problem since such difference is very small although an extra skew compensation circuit is not employed.

Figure 4:
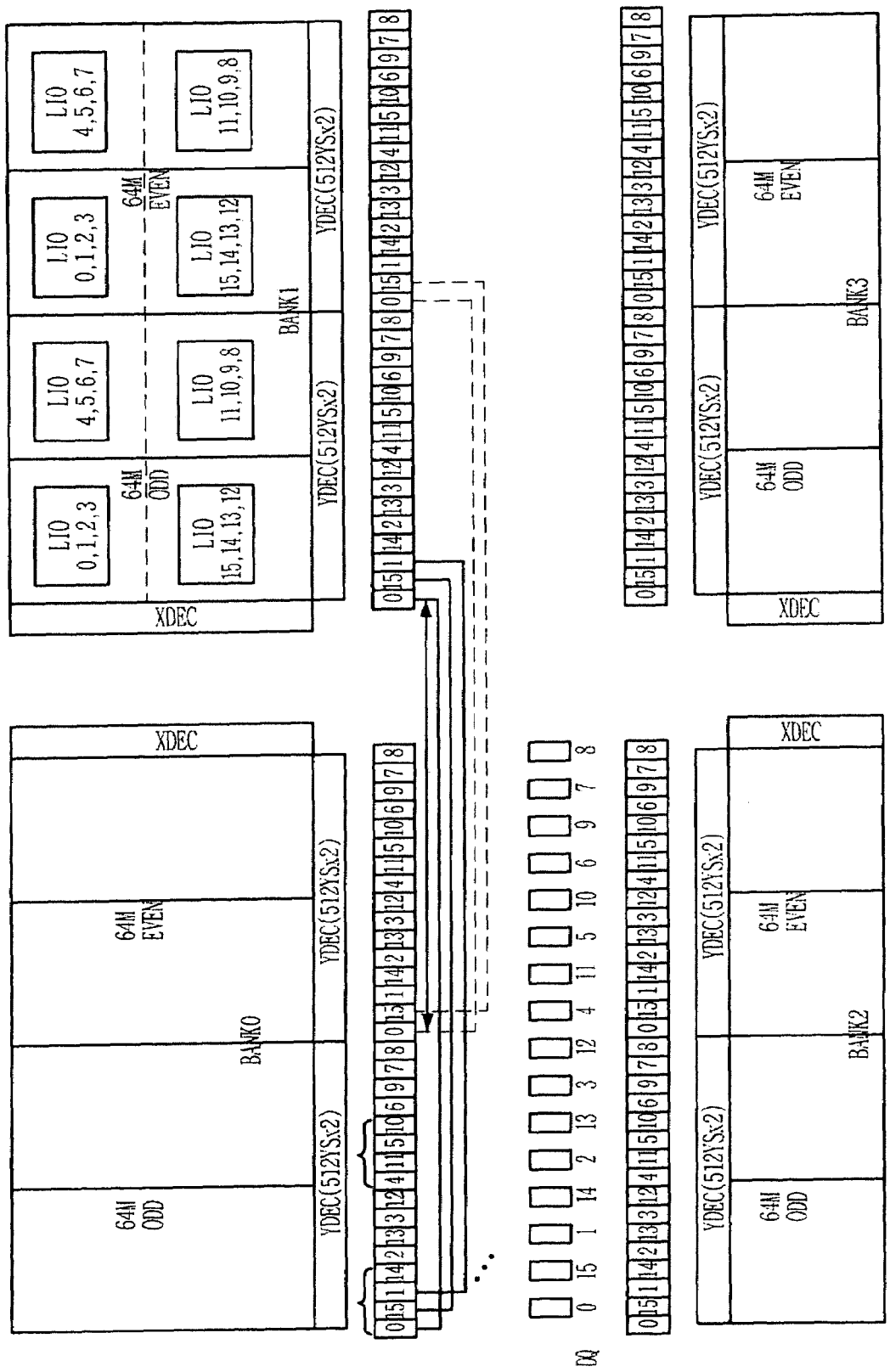
FIG. 4 is a diagram depicting an arrangement scheme of global data bus GIO of a 512M DDR2 DRAM in accordance with a third embodiment of the present invention.

FIG. 4 is a diagram showing an arrangement method of a global data bus GIO of a 512M DDR2 DRAM in accordance with a third embodiment of the present invention.

Referring to FIG. 4, in the third embodiment in accordance with the present invention, odd cell regions and even cell regions in two banks BANK0 and BANK1 are not classified into separate groups as in the first and the second embodiments. However, if data transmission units corresponding to the odd cell regions are assumed to be a first group, and data transmission units corresponding to the even cell regions are assumed to be a second group, it can be seen that this embodiment is under the same principle as the first embodiment.

According to the line arrangement sequence of the global data bus GIO, a bus line corresponding to one data transmission unit selected among data transmission units corresponding to odd cell regions is arranged, and then a bus line corresponding to one data transmission unit selected in data transmission units corresponding to even cell regions is arranged; and following lines in the data transmission units corresponding to the odd cell regions and the even cell regions are alternately arranged in sequence.

As a result, the bus lines of the global data bus GIO are arranged in the order of $0_{ODD}$, $0_{EVEN}$, $4_{ODD}$, $4_{EVEN}$, $15_{ODD}$, $15_{EVEN}$, $11_{ODD}$, $11_{EVEN}$, $1_{ODD}$, $1_{EVEN}$, $5_{ODD}$, $5_{EVEN}$, $14_{ODD}$, $14_{EVEN}$, $10_{ODD}$, $10_{EVEN}$, $2_{ODD}$, $2_{EVEN}$, $6_{ODD}$, $6_{EVEN}$, $13_{ODD}$, $13_{EVEN}$, $9_{ODD}$, $9_{EVEN}$, $3_{ODD}$, $3_{EVEN}$, $7_{ODD}$, $7_{EVEN}$, $12_{ODD}$, $12_{EVEN}$, $8_{ODD}$, and $8_{EVEN}$.

Using this embodiment of the present invention, it can be seen that overlap interval (indicated by an arrow) between adjacent bus lines is reduced by about ½ compared to the prior art (see FIG. 1), which makes coupling noise of the global data bus GIO minimized. Also, because overlap intervals between all adjacent bus lines are identical perfectly, there exists no skew between the bus lines.

As a result, the present invention can reduce coupling noise without an increase of chip area by minimizing overlap intervals between adjacent bus lines using a novel global data bus arrangement scheme, to thereby prevent data errors in a semiconductor memory device.

Although the technical sprit of the invention is concretely presented by some preferred embodiments, it should be noted that those particular embodiments are illustrated to explain the invention merely, not to limit the invention. Furthermore, a person skilled in the art will appreciate that various changes and modifications may be made without departing from the spirit and scope of the invention as defined in the following claims.

For instance, although there is illustratively explained an example that employs 16-bit global data bus in the above embodiments, the present invention may be applied to any examples where line number of the global data bus increases to 32 bits, 64 bits, etc.

Further, although it is illustratively explained that the invention is applied to 4-bank memory in the above embodiments, the invention may be applied to any instances at which the number of banks is larger than 2.

Also, although it is illustratively described that the routing order in each group of data transmission units is made in sequence and groups are symmetrical in the above embodiments, the invention may be applied to any instances at which the routing order in each group of the data transmission units is not made in sequence and the groups are not symmetrical.

Furthermore, although it is illustratively disclosed that the global data bus is arranged across two banks neighboring in a row direction in the above embodiments, the invention may be applied to any examples, regardless of the arrangement direction of the global data bus and the number of banks sharing the same.

Moreover, in the case of the firs and the second embodiments as mentioned above, it may also be applied to a memory device at which the banks are not classified into odd cell regions and even cell regions.

The present application contains subject matter related to Korean patent application No. 2004-32794, filed in the Korean Patent Office on May 10, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device having a plurality of banks, comprising:
    a plurality of input/output (I/O) pads prepared for data input and output;
    a global data bus arranged between banks neighboring in a first direction and the I/O pads; and
    a plurality of data transmission units for data transmission between each bank and the global data bus,
    wherein the data transmission units corresponding to said each bank are classified into a multiplicity of groups, each group having plural continuous data transmission units, and bus lines in the first direction of the global data bus corresponding to each data transmission unit are arranged sequentially and alternately for each group.

2. The semiconductor memory device as recited in claim 1, wherein bus lines in the first direction of the global data bus corresponding to the data transmission units included in each group are arranged in sequence.

3. The semiconductor memory device as recited in claim 2, wherein the arrangement order of the bus lines in the first direction of the global data bus is symmetrical for each group.

4. A semiconductor memory device having a plurality of banks, comprising:
    16 input/output (I/O) pads for data input and output, which are arranged in the order of 0, 15, 1, 14, 2, 13, 3, 12, 4, 11, 5, 10, 6, 9, 7, and 8;
    a global data bus arranged between a first and a second banks neighboring in a row direction and the 16 I/O pads; and
    16 data transmission units for data transmission between each bank and the global data bus, which are arranged in the order of 0, 15, 1, 14, 2, 13, 3, 12, 4, 11, 5, 10, 6, 9, 7, and 8,
    wherein bus lines in the first direction of the global data bus corresponding to each data transmission unit are arranged in the order of 0, 4, 15, 11, 1, 5, 14, 10, 2, 6, 13, 9, 3, 7, 12, and 8.

* * * * *